US009461188B2

(12) United States Patent
Nakayama et al.

(10) Patent No.: US 9,461,188 B2
(45) Date of Patent: Oct. 4, 2016

(54) ELECTRO-CONDUCTIVE PASTE FOR FORMING AN ELECTRODE OF A SOLAR CELL DEVICE, A SOLAR CELL DEVICE AND METHOD FOR PRODUCING THE SOLAR CELL DEVICE

(71) Applicant: KYOTO ELEX CO., LTD., Kyoto-shi (JP)

(72) Inventors: Masashi Nakayama, Kyoto (JP); Nobuo Ochiai, Nagaokakyo (JP); Takashi Hinotsu, Okayama (JP); Yutaka Nakayama, Kyoto (JP); Masami Sakuraba, Konosu (JP); Wataru Fujimori, Takatsuki (JP)

(73) Assignee: KYOTO ELEX CO., LTD., Kyoto-shi (JP)

(*) Notice: Subject to any disclaimer, the term of this patent is extended or adjusted under 35 U.S.C. 154(b) by 107 days.

(21) Appl. No.: 14/471,205

(22) Filed: Aug. 28, 2014

(65) Prior Publication Data

US 2015/0020880 A1  Jan. 22, 2015

Related U.S. Application Data

(63) Continuation of application No. 13/057,744, filed as application No. PCT/JP2009/003151 on Jul. 7, 2009, now Pat. No. 8,852,465.

(30) Foreign Application Priority Data

Aug. 7, 2008 (JP) ................. 2008-204294
Dec. 19, 2008 (JP) ................. 2008-323940
Apr. 22, 2009 (JP) ................. 2009-104088
May 8, 2009 (JP) ................. 2009-113475

(51) Int. Cl.
*H01L 31/0224* (2006.01)
*H01L 31/0216* (2014.01)

(Continued)

(52) U.S. Cl.
CPC ......... *H01L 31/022425* (2013.01); *H01B 1/22* (2013.01); *H01L 31/02168* (2013.01);

(Continued)

(58) Field of Classification Search
None
See application file for complete search history.

(56) References Cited

U.S. PATENT DOCUMENTS 5,066,621 A  11/1991  Akhtar
2009/0095344 A1  4/2009  Machida et al.
2009/0250106 A1*  10/2009  Hayashi ............ H01L 31/02242
136/256

FOREIGN PATENT DOCUMENTS

CN  1198841 A  11/1998
CN  101164943 A  4/2008

(Continued)

OTHER PUBLICATIONS

Derwent English text abstract for Ikeda et al. (JP 05-128910 A), Acc-No. 1993-201613.

(Continued)

*Primary Examiner* — Mark Kopec
*Assistant Examiner* — Katie L Hammer
(74) *Attorney, Agent, or Firm* — Marshall, Gerstein & Borun LLP

(57) ABSTRACT

In order to provide an electro-conductive paste bringing no increase of the contact resistance for forming an electrode of a solar cell device, the electro-conductive paste is characterized by containing an electro-conductive particle, an organic binder, a solvent, a glass frit, and an organic compound including alkaline earth metal, a metal with a low melting point or a compound affiliated with a metal with a low melting point.

4 Claims, 2 Drawing Sheets

(51) Int. Cl.
  *H01L 31/18* (2006.01)
  *H01B 1/22* (2006.01)
  *H01L 31/068* (2012.01)
  *H05K 1/09* (2006.01)

(52) U.S. Cl.
  CPC ............ *H01L31/068* (2013.01); *H01L 31/18* (2013.01); *H05K 1/092* (2013.01); *Y02E 10/52* (2013.01); *Y02E 10/547* (2013.01)

(56) References Cited

FOREIGN PATENT DOCUMENTS

| | | |
|---|---|---|
| JP | 05-128910 A | 5/1993 |
| JP | 2001-284754 A | 10/2001 |
| JP | 2005-243500 A | 9/2005 |
| JP | 2009-099781 A | 5/2009 |
| TW | 200424276 | 4/2003 |
| TW | 200811883 A | 3/2008 |
| WO | WO-97/13280 A1 | 4/1997 |
| WO | WO-2004/090942 A2 | 10/2004 |
| WO | WO-2007/032151 A1 | 3/2007 |
| WO | WO-2007/125879 A1 | 11/2007 |
| WO | WO-2008/001518 A1 | 1/2008 |
| WO | WO 2008001518 A1 * | 1/2008 ..... H01L 31/022425 |
| WO | WO-2009/152238 A2 | 12/2009 |

OTHER PUBLICATIONS

Extended European Search Report for EP 13170794.5, dated Jul. 2, 2013.
Extended European Search Report for European Patent Application No. 09804673.3, dated Nov. 7, 2012.
International Search Report for PCT/JP2009/003151, mailed Sep. 8, 2009.
Office Action for Chinese Patent Application No. 200980100764.5, dated Aug. 23, 2011.
Office Action for Taiwanese Patent Application No. 098123847, dated Dec. 24, 2012.

* cited by examiner (a)

(b)

ELECTRO-CONDUCTIVE PASTE FOR FORMING AN ELECTRODE OF A SOLAR CELL DEVICE, A SOLAR CELL DEVICE AND METHOD FOR PRODUCING THE SOLAR CELL DEVICE

TECHNICAL FIELD

The present invention relates to an electro-conductive paste for forming an electrode of a solar cell device, the solar cell device having the electrode formed by the electro-conductive paste and a method for producing the solar cell device.

BACKGROUND ART

As shown in FIG. 4, a conventional solar cell device is provided with a semiconductor board 21, a diffusion layer 22, an antireflection layer 23, a back electrode 24, and a surface electrode 25.

For example, the solar cell device is produced as described below. The diffusion layer 22 comprising impurity, and the insulating antireflection layer 23 consisting of silicon nitride, silicon oxide, titanium oxide and the like are layered upon a light-absorbing side (surface side) of the semiconductor board 21 consisting of silicon in order. The semiconductor board 21 contains semiconductor impurity such as boron of $1 \times 10^{16}$-$10^{18}$ atoms/cm$^3$ and presents one electro-conductive type (e.g., p-type) with specific resistance of about 1.5 Ωcm. Single crystal silicon is produced by a pulling up method and poly crystal silicon is produced by a casting method. Poly crystal silicon can be mass-produced and poly crystal silicon is more advantageous than single crystal silicon in production cost. The semiconductor board 21 can be obtained by slicing a piece with a thickness of about 100 to 300 μm of ingot produced by the pulling up method or the casting method.

The diffusion layer 22 is formed by diffusing impurity such as phosphorus on the light-absorbing side of the semiconductor board 21 and presents contrary electro-conductive type (e.g., n-type) to the semiconductor board 21. The diffusion layer 22 is, for example, formed by placing the semiconductor board 21 in the inside of a furnace and heating the semiconductor board 21 in a gas containing phosphorus oxychloride (POCl$_3$).

The antireflection layer 23 is formed on the light-absorbing side of the diffusion layer 22 in order to possess the antireflection function and protect the solar cell device. The antireflection layer 23, which is consisted of silicon nitride membrane, for example, is formed by plasma enhanced chemical vapor deposition in which a mixing gas of silane (SiH$_4$) and ammonia (NH$_3$) becomes plasma by the glow-discharge and the resultant matter is accumulated. For example, taking consideration of a difference of refractive index from the semiconductor board 21, the refractive index of the antireflection layer 23 is made to a range of about 1.8 to 2.3 and the thickness of the antireflection layer 23 is made to a range of about 0.05 μm to 1.0 μm.

The surface electrode 25 is formed on the surface of the semiconductor board 21 and the back electrode 24 is formed on the back of the semiconductor board 21. The surface electrode 25 is formed by printing, drying and sintering an electro-conductive paste which contains an electro-conductive particle, an organic binder, a solvent, a glass frit and an optional matter. The back electrode 24 is also formed by printing, drying and sintering the electro-conductive paste. It is not necessary for the back electrode 24 to use the same electro-conductive paste as the surface electrode 25. Particularly, the surface electrode 25 plays a part as fire-through and it is important for improving the functions of the solar cell to adopt an appropriate composition and an appropriate sintering condition of the surface electrode 25. This fire-through is a following phenomenon:

In sintering, the glass frit contained in the electro-conductive paste works for the antireflection layer 23 and the antireflection layer 23 is dissolved. As a result, the surface electrode 25 and the diffusion layer 22 touch each other and an ohmic contact is obtained between the surface electrode 25 and the diffusion layer 22.

If the stable ohmic contact is not obtained between the surface electrode 25 and the diffusion layer 22, an electric resistance in series increases and a curved factor (FF) tends to decrease. Since the transformation efficiency of the solar cell is obtained by multiplying open-voltage by short-circuit electric current density and FF, if FF becomes smaller, the transformation efficiency of the solar cell is decreased.

Well, the properties of the cell are important for enhancing the power characteristic of the solar cell. For example, the power efficiency is increased by decreasing the electric resistance of the electrode. In order to attain the object, the following electro-conductive paste is disclosed in patent publication 1:

The electro-conductive paste contains an organic binder, a solvent, a glass frit, an electro-conductive particle, at least one metal or a metallic compound selected from a group of Ti, Bi, Zn, Y, In and Mo. The average particle diameter of the metal or the metallic compound is above 0.001 μm and under 0.1 μm.

Patent publication 1 states that it is possible to form a surface electrode having a stable high electro-conductivity and a good adhesion between the semiconductor and the electro-conductive paste by intervention of the antireflection layer, as a result of sintering of the electro-conductive paste containing the super-minute metal particle or the metallic compound. But, depending on the composition of the electro-conductive paste, as particularly shown in patent publication 1, after printing and drying the electro-conductive paste containing the super-minute particle metal or the metallic compound on the surface of the semiconductor board, the coating film (the paste film) shrinks and the contact resistance is increased by sintering. In one case, micro crack may be generated the surface of the semiconductor board by difference of thermal shrinkage action (coefficient of linear expansion) between the paste film and the semiconductor board. If the contact resistance is increased, as described above, FF becomes smaller and the transformation efficiency of the solar cell is decreased.

PRIOR ART PUBLICATION

Patent Publication

Patent Publication 1: Japanese Laid-open Patent Application Publication No. 2005-243500

SUMMARY OF INVENTION

Problems to be Solved by the Invention

In view of the forgoing, the object of the present invention is to provide an electro-conductive paste bringing no increase of the contact resistance for forming an electrode of a solar cell device, a solar cell device having the electrode formed by the electro-conductive paste and a method for producing the solar cell device.

Means for Solving the Problems

In order to achieve the object, an electro-conductive paste for forming an electrode of a solar cell device of the present invention is characterized by containing an electro-conductive particle, an organic binder, a solvent, a glass frit, and an organic compound including alkaline earth metal The electro-conductive paste for forming an electrode of a solar cell device of the present invention is also characterized by containing an electro-conductive particle, an organic binder, a solvent, a glass frit, and a metal with a low melting point Further, the electro-conductive paste for forming an electrode of a solar cell device of the present invention is also characterized by containing an electro-conductive particle, an organic binder, a solvent, a glass frit, and an organic compound including alkaline earth metal and a metal with a low melting point.

Still further, the electro-conductive paste for forming an electrode of a solar cell device of the present invention is also characterized by containing an electro-conductive particle, an organic binder, a solvent, a glass frit, and a compound affiliated with a metal with a low melting point Further, the electro-conductive paste for forming an electrode of a solar cell device of the present invention is also characterized by containing an electro-conductive particle, an organic binder, a solvent, a glass frit, an organic compound including alkaline earth metal and a compound affiliated with a metal with a low melting point.

Preferably, the organic compound including alkaline earth metal may be an alkaline earth metal soap.

Preferably, the alkaline earth metal soap may be magnesium stearate.

Preferably, the metal with a low melting point may be Te or Se.

Preferably, the compound affiliated with a metal with a low melting point may be $TeO_2$.

Preferably, the electro-conductive paste for forming an electrode of a solar cell device of the present invention contains an organic compound including an alkaline earth metal of 0.1 to 5 percent by weight.

Preferably, the electro-conductive paste for forming an electrode of a solar cell device of the present invention contains a metal with a low melting point of 0.1 to 5 percent by weight.

Preferably, the electro-conductive paste for forming an electrode of a solar cell device of the present invention contains an organic compound including an alkaline earth metal of 0.1 to 5 percent by weight and a metal with a low melting point of 0.1 to 5 percent by weight.

Preferably, the electro-conductive paste for forming an electrode of a solar cell device of the present invention contains a compound affiliated with a metal with a low melting point of 0.01 to 10 percent by weight.

Preferably, the electro-conductive paste for forming an electrode of a solar cell device of the present invention contains an organic compound including an alkaline earth metal of 0.1 to 5 percent by weight and a compound affiliated with a metal with a low melting point of 0.01 to 10 percent by weight.

A solar cell device of the present invention is characterized in that a diffusion layer is formed on a light-absorbing side of a semiconductor board, an antireflection layer and a surface electrode are formed on the diffusion layer and a back electrode is formed on the other side of the light-absorbing side of the semiconductor board, wherein the surface electrode is formed by printing and sintering the above electro-conductive paste on the antireflection layer.

A method for producing the solar cell device of the present invention is characterized in that a diffusion layer is formed on a light-absorbing side of a semiconductor board, an antireflection layer is formed on the diffusion layer, the above electro-conductive paste is printed on the antireflection layer, an electro-conductive paste for forming a back electrode is printed on the other side of the light-absorbing side of the semiconductor board, the electro-conductive paste printed on the antireflection layer is sintered to form a surface electrode by being connected to the diffusion layer and the electro-conductive paste for forming a back electrode is sintered to form a back electrode.

Effects of the Invention

In accordance with the present invention, it is possible to provide an electro-conductive paste bringing no increase of the contact resistance for forming an electrode of a solar cell device, a solar cell device having the electrode formed by the electro-conductive paste and a method for producing the solar cell device.

Figure 1:
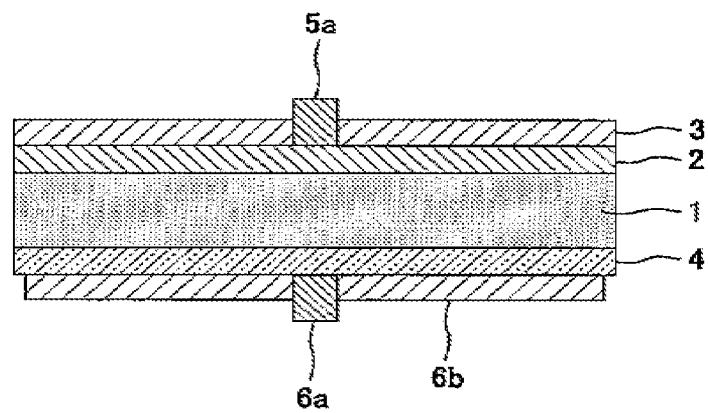
FIG. 1 is a section view showing an embodiment of a solar cell device of the present invention.

EMBODIMENTS FOR CARRYING OUT THE INVENTION (1) Electro-Conductive Particle

As examples of electro-conductive particles, silver powders, silver oxide powders, silver carbonate powders, silver acetate powders, powders coated with silver, silver-containing alloy powders, nickel powders, copper powders and the like are given. Single or a mixture of two or more thereof can be used.

Preferably, the electro-conductive particles contain silver of 70 to 90 percent by mass. In case that the electro-conductive paste printed on the antireflection layer is sintered to be connected to the diffusion layer, the sintering temperature is a temperature in a range of about 750 to 900° C. Even if non-reducing atmosphere is applied to silver, the electro-conductivity may be not decreased by surface-oxidation.

Preferably, a compounding quantity of the electro-conductive particles may be 65 to 90 percent by weight to the whole electro-conductive paste. Under 65 percent by weight, the compounding quantity of the electro-conductive particles is too little and a resistivity of the light-absorbing side electrode obtained by sintering is increased. Above 95 percent by weight, a printing function is lowered and a physical adhesion strength becomes insufficient.

The shape of the electro-conductive particles may be scale-shaped, spherical-shaped, flake-shaped, indefinite-shaped and a mixture thereof.

Preferably, an average particle diameter of the electro-conductive particle may be a range of 0.1 to 15 µm because it affects the sintering characteristic (a larger electro-conductive particle is sintered slower than a smaller electro-conductive particle). Under 0.1 µm, a sintering speed is too fast and physical adhesion strength becomes insufficient. Above 15 µm, a sintering speed may be a little slow but a dispersion function and a printing function in the paste become bad. As a result, it is difficult to print a fine line. In this description, an average particle diameter denotes a particle diameter of a cumulative 50 percent accumulated from small diameter side, in case that the particle diameter has been measured by the micro-track particle size distribution measuring method.

Preferably, a specific surface area of the electro-conductive particle may be a range of 0.05 to 5 m$^2$/g. Under 0.05 m$^2$/g, the particle diameter becomes large and it is not possible to print a fine line. Above 5 m$^2$/g, a large amount of solvent is needed to adjust the viscosity and the work efficiency is lowered.

(2) Glass Frit

Preferably, a glass frit which can be used in the present invention has a softening point of temperature in a range of 300 to 550° C. so that an antireflection layer may be eroded and an appropriate connection to a semiconductor board may be conducted when the electro-conductive particle is sintered at a temperature in a range of 750 to 950° C. If the softening point is lower than 300° C., the sintering is excessively progressing and it is not possible to get the advantages of the present invention. On the other hand, if the softening point is higher than 550° C., a sufficient melting fluidizing does not occur at a time of sintering and it is not possible to get sufficient adhesion strength. For example, as examples of glass frits, Bi-containing glass, $Bi_2O_3$—$B_2O_3$—ZnO-containing glass, $Bi_2O_3$—$B_2O_3$ containing glass, $Bi_2O_3$—$B_2O_3$—$SiO_2$ containing glass, Ba containing glass and BaO—$B_2O_3$—ZnO containing glass and the like can be used.

The shape of the glass frit may be spherical-shaped or indefinite-shaped.

Preferably, a compounding quantity of the glass frits may be a range of 0.1 to 10 percent by weight to the whole electro-conductive paste. Under 0.1 percent by weight, an adhesion strength becomes insufficient. Above 10 percent by weight, a flotation of glass and a poor soldering occur.

As the detailed properties of glass frits, Bi-containing glass frit may contain $B_2O_3$ of 1 to 10 percent by weight, BaO of 1 to 10 percent by weight, $Bi_2O_3$ of 70 to 80 percent by weight, $Sb_2O_3$ of 1 percent by weight or less, and the others (except said matters, ZnO and CaO) of 10 percent by weight or less and its softening point may be a temperature of about 430° C. Ba-containing glass frit may contain $B_2O_3$ of 20 percent by weight or more, ZnO of 20 percent by weight or less, BaO of 40 percent by weight or more, and CaO of 10 percent by weight or more and its softening point may be a temperature of about 530° C.

(3) An Organic Compound Including Alkaline Earth Metal, a Metal with a Low Melting Point and a Compound Affiliated with a Metal with a Low Melting Point An organic compound including alkaline earth metal and a metal with a low melting point function as sintering controlling agent. A metal with a low melting point function is a metal having melting temperature of 500° C. or less. Examples of the metal with a low melting point are zinc (melting point of 419.6° C.), lead (melting point of 327.5° C.), tin (melting point of 231.97° C.), bismuth (melting point of 271.3° C.), tellurium (melting point of 449.5° C.) and selenium (melting point of 217° C.). Among those metals, preferably tellurium of semiconductor whose specific resistance is 0.436 Ωcm may be used. Furthermore, in place of metal with a low melting point, a matter having melting point lower than sintering temperature of the electro-conductive paste, e.g. tellurium dioxide (melting point of 732.6° C.) may be used. That is, in place of metal with a low melting point, can be used a matter having melting point lower than sintering temperature of the electro-conductive paste (a compound affiliated with a metal with a low melting point such as tellurium dioxide) or a matter showing chemical reaction (physical transformation) at a temperature lower than sintering temperature of the electro-conductive paste.

As an organic compound including alkaline earth metal, preferably alkaline earth metal soap may be used. Calcium stearate, magnesium stearate, strontium stearate and magnesium gluconate and the like may be used as concrete alkaline earth metal soap.

The alkaline earth metal soap has a high surface activity and disperses uniformly the electro-conductive particles as a kind of protective colloid and controls an excessive sintering of the elector-conductive particles at sintering in the air atmosphere. As a result, it can be expected that the elector-conductive particles shows no much different thermal shrinkage action from silicon of semimetallic element which is main component of the semiconductor board. Further, if the electro-conductive paste contains a metal with a low melting point or a compound affiliated with a metal with a low melting point, the metal with a low melting point or the compound affiliated with a metal with a low melting point is liable to be oxidized when the electro-conductive paste is sintered in the air atmosphere. That is, an oxidation film is naturally formed at the sintering process of the electro-conductive paste and an excessive sintering of the electro-conductive particles is controlled and it can be expected that the electro-conductive particles shows no much different thermal shrinkage action from silicon of semimetallic element which is main component of the semiconductor board. Thus, after the electro-conductive paste of the present invention is printed and dried on the surface of the semiconductor board, a micro-crack is not generated or a contact resistance is not increased at the time of sintering.

In order to obtain the above advantage, preferably the electro-conductive paste may contain an organic compound including alkaline earth metal of adequate quantity, a metal with a low melting point of adequate quantity, an organic compound including alkaline earth metal of adequate quantity and a metal with a low melting point of adequate quantity, a compound affiliated with a metal with a low melting point of adequate quantity, and an organic compound including alkaline earth metal of adequate quantity and a compound affiliated with a metal with a low melting point of adequate quantity. Specifically, preferably the electro-conductive paste may contain an organic compound including alkaline earth metal of 0.1 to 5 percent by weight. Further, preferably the electro-conductive paste may contain a metal with a low melting point of 0.1 to 5 percent by weight. Still further, preferably the electro-conductive paste may contain an organic compound including alkaline earth metal of 0.1 to 5 percent by weight and a metal with a low melting point of 0.1 to 5 percent by weight. Further, preferably the electro-conductive paste may contain a compound affiliated with a metal with a low melting point of 0.10 to 10 percent by weight, more preferably 0.1 to 8 percent by weight, still more preferably 0.1 to 4 percent by weight. Still further, preferably the electro-conductive paste may contain an organic compound including alkaline earth metal of 0.1 to 5 percent by weight and a compound affiliated with a metal with a low melting point of 0.10 to 10 percent by weight, more preferably 0.1 to 8 percent by weight, still more preferably 0.1 to 4 percent by weight. Under the lower limit of the above numerical range, an excessive sintering of the electro-conductive particles cannot be controlled. Above the upper limit of the above numerical range, an electric resistance is increased and FF value becomes lower.

Compounds of selenium such as ferroselenium, alloy selenide, selenium dioxide, selenious acid salt, selenic acid salt, selenium disulfide, selenium organic metallic compound and the like may be contained in the electro-conductive paste.

Further, compounds of tellurium such as the following inorganic compounds of tellurium or organic compounds of tellurium may be contained in the electro-conductive paste:

Tellurium chloride, tellurium dioxide, tellurious acid compound, zinc telluride, tellurium tetrabromide, aluminum telluride, cadmium telluride, hydrogen telluride, potassium telluride, sodium telluride, gallium telluride, silver telluride, chromium telluride, germanium telluride, cobalt telluride, mercury telluride, tin telluride, tungsten telluride, titanium telluride, copper telluride, lead telluride, bismuth telluride, arsenic telluride, manganese telluride, molybdenum telluride, telluric acid, ammonium metatelluric acid, potassium metatelluric acid, rubidium metatelluric acid, sodium metatelluric acid, lead metatelluric acid, tellurium iodide, tellurium sulfide, diphenylditellurido, tellurium octylate.

Either compound of selenium and tellurium selected from the above compounds or both compounds of selenium and tellurium may be contained in the electro-conductive paste.

Particularly, ZnTe having the minimum energy gap (energy gap between the valence band and the empty band) of 2.26 eV is a direct bandgap compound semiconductor and its impurity level obtained by addition of silver is 0.11 eV away from the top of the valence band and relatively near the top of the valence band. If an electron has no energy enough to go beyond the forbidden band between the valence band and the empty band and move to empty band, the electron stays at the valence band and the electrical conduction does not occur. The electrical conduction occurs by the electron's jumping over the valence band or the impurity level by absorption of heat or light. In this point, small energy gap between the valence band or the impurity level is advantageous and particularly, ZnTe may be preferably used among compounds of tellurium.

(4) Organic Binder

As organic binders, the following matters may be used but not limited:

Cellulose derivatives such as methylcellulose, ethylcellulose and the like, acrylic resin, alkyd resin, polypropylene resin, polyvinyl chloride plastics, polyurethane resin, rosin resin, polyterpene, phenolic resin, aliphatic petroleum resin, acrylic esters, xylene formaldehyde resin, cumarone-indene copolymer, styrene resin, dicyclopentadiene, polybutene, poly ether, urea formaldehyde resin, melamine formaldehyde resin, poly vinyl acetate plastics, poly isobutyl.

Preferably, a compounding quantity of the organic binders may be a range of 0.1 to 30 percent by weight to the whole electro-conductive paste. Under 0.1 percent by weight, sufficient adhesion strength cannot be obtained. Above 30 percent by weight, a printing function is lowered due to increase of paste viscosity.

(5) Solvents

As solvents, the following matters may be used but not limited:

Hexane, toluene, ethyl cellosolve, cyclohexanone, butyl cellosolve, butyl cellosolve acetate, butyl carbitol, butyl carbitol acetate, diethylene glycol diethyl ether, diacetone alcohol, terpineol, methyl ethyl ketone, benzyl alcohol.

Preferably, a compounding quantity of the solvents may be a range of 0.1 to 40 percent by weight to the whole electro-conductive paste. Under or above the range, a printing function is lowered.

(6) Dispersion Agents

Dispersion agents such as stearic acid, palmitic acid, myristic acid, oleic acid, lauric acid and the like may be contained in the electro-conductive paste. If the dispersion agent is conventional, it is not limited to organic acid. Preferably, a compounding quantity of the dispersion agent may be a range of 0.05 to 10 percent by weight to the whole electro-conductive paste. Under 0.05 percent by weight, a dispersing function becomes poor. Above 10 percent by weight, a resistivity of a light-absorbing side electrode obtained by sintering is increased.

(7) Other Additives

Additives such as stabilizing agent, antioxidant, ultraviolet absorbent, silane coupling agent, defoaming agent, viscosity adjusting agent and the like may be contained in the electro-conductive paste without hindering the function of the present invention.

(8) Method for Producing Solar Cell Device

A method for producing a solar cell device in accordance with present invention will be described below in detail.

Figure 2:
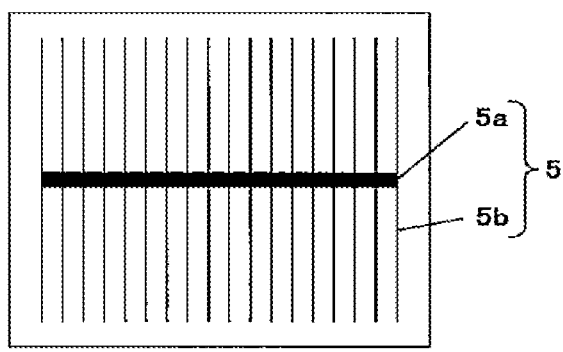
FIG. 2(a) is a plan view showing a light-absorbing side of an embodiment of a solar cell device of the present invention.
FIG. 2(b) is a plan view showing the other side of the light-absorbing side of an embodiment of a solar cell device of the present invention.
Figure 2:
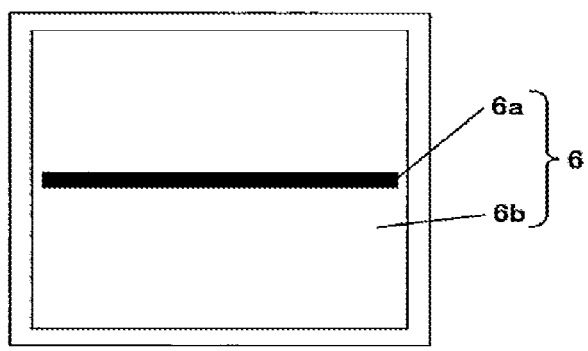

FIG. 1 is a schematic section view showing an embodiment of a solar cell device of the present invention. FIG. 2 is a view showing of an example of an electrode of the present invention. FIG. 2(*a*) is a plan view showing a light-absorbing side (surface side) of a solar cell device, and FIG. 2(*b*) is a plan view showing the other side (back side) of the light-absorbing side of the solar cell device.

A silicon board 1 consists of single crystal silicon or poly crystal silicon and the like. The silicon board 1 contains one electro-conductive type semiconductor impurity such as boron and its specific resistance is in the range of about 1.0 to 2.00 cm. Single crystal silicon is produced by a pulling up method and poly crystal silicon is produced by a casting method. The silicon board 1 is obtained by slicing the silicon ingot produced by the pulling up method or the casting method to a thickness of 200 µm or less, preferably 150 µm or less. The following is described about p-type silicon board but n-type silicon board may be used.

The surface of the silicon board 1 is minutely etched by NaOH, KOH, hydrofluoric acid, fluoro nitric acid and the like in order to clean the slicing surface.

After that, an uneven surface (rough surface) which can reduce a reflectivity of light may be preferably formed on the surface (light-absorbing side) of the silicon board being a plane of incidence of light by dry-etching or wet-etching.

Next, a n-type diffusion layer 2 is formed. Phosphorus may be preferably used as n-type doping element and $n^+$ type whose sheet resistance may be in the range of about 40 to 100Ω/□ is obtained. P-n join portion is formed between the p-type silicon board 1 and the n-type diffusion layer 2.

The n-type diffusion layer 2 is formed on the light-absorbing side of the silicon board by the coating thermal diffusion in which paste-like $P_2O_5$ is coated and thermal-diffused, the vapor phase thermal diffusion having gaseous $POCl_3$ as diffusion source, and the ion implantation in which P+ ion is directly diffused and the like. The depth of the n-type diffusion layer 2 may be in the range of about 0.3 to 0.5 μm.

If a diffusion area has been formed on the unexpected portion, the diffusion area may be removed by etching. As described below, if BSF area of the back side (the other side of the light-absorbing side) is formed by aluminum paste, since the aluminum paste being p-type doping agent can be diffused to a sufficient depth with a sufficient density, the influence of a shallow n-type diffusion layer can be ignored and it is not necessary to remove the n-type diffusion layer formed on the back side.

The method for forming the n-type diffusion layer is not limited to the above methods. For example, by applying a thin layer technology, amorphous silicon membrane hydride, crystalline silicon membrane including micro crystal silicon membrane and the like may be formed. Further, i-type silicon board (not shown) may be formed between the p-type silicon board 1 and the n-type diffusion layer 2.

Next, a antireflection layer 3 is formed. SiNx membrane (composition x has a range such that the middle compound is $Si_3N_4$), $TiO_2$ membrane, $SiO_2$ membrane, MgO membrane, ITO membrane, $SnO_2$ membrane, ZnO membrane and the like may be used as the material of the antireflection layer 3. The thickness of the antireflection layer may be adequately selected to the semiconductor material in order to reproduce no reflection condition to an appropriate light of incidence. For example, a refractive index may be in the range of about 1.8 to 2.3 and the thickness of the antireflection layer 3 may be in a range of about 500 to 1000 angstroms.

The chemical vapor deposition, the vapor deposition, the sputtering and the like may be used as the methods for producing the antireflection layer 3.

Next, BSF (back surface field) layer 4 may be preferably formed. The BSF layer is a region in which one electro-conductive type semiconductor impurity is diffused in high density on the back side of the silicon board 1. The BSF layer acts a role of preventing a decrease of transformation efficiency by re-combination of carrier. Boron and aluminum may be used as impurity elements. If the density of impurity element is made high to become p+ type, an ohmic contact can be obtained between the BSF layer 4 and a back electrode 6 as described below.

The BSF layer 4 may be formed at a temperature in a range of about 800 to 1000° C. by the thermal diffusion having $BBr_3$ as a diffusion source. If the thermal diffusion is applied, it is desirable to form a diffusion barrier such as oxidation layer on then-type diffusion layer 2 in advance. If the other method using aluminum is applied, after aluminum paste containing aluminum powder or organic vehicle has been coated, aluminum can be diffused toward the silicon board 1 by sintering at a temperature in a range of about 600 to 850° C. By this method, the diffusion layer can be formed on the coating surface by request and it is not necessary to remove unnecessary diffusion layer on the back side. Furthermore, sintered aluminum may be used as the current collecting electrode of the back side.

Next, a surface electrode 5 consisting of a bus bar electrode 5a and a finger electrode 5b as shown in FIG. 2(a), and a back electrode 6 consisting of a bus bar electrode 6a and a current collecting electrode 6b as shown in FIG. 2(b), are formed on the surface side and the back side of the silicon board 1 respectively.

The surface electrode 5 is formed by a process such that the electro-conductive paste for forming an electrode of a solar cell device of the present invention is coated on the silicon board 1 by a known coating procedure, and the paste is sintered for dozens of seconds to dozens of minutes at a peak temperature in a range of about 750 to 950° C.

The back electrode 6 may be such that as shown in FIG. 2(b), the bus bar electrode 6a obtained by coating and sintering silver-aluminum paste containing silver powders, aluminum powders, organic binder, solvent and glass frit, and the current collecting electrode 6b obtained by coating and sintering aluminum paste containing aluminum powders, organic binder, solvent and glass frit almost on the whole surface of silicon board 1 may overlap in part.

After the electro-conductive pastes for forming the surface electrode and the back electrode have been coated and dried, if both pastes have been sintered at the same time, preferably production processes can be decreased. The order of coating of the above pastes is not limited.

The pattern of electrode by the electro-conductive paste may be a conventional pattern, and a comb type can be adopted in order to collect effectively current from the solar cell device, as shown in FIG. 2(a), in case of the surface electrode.

(9) Method for Producing the Solar Cell Module

One example of producing the solar cell module using the solar cell device produced as described above will be described below.

Figure 3:
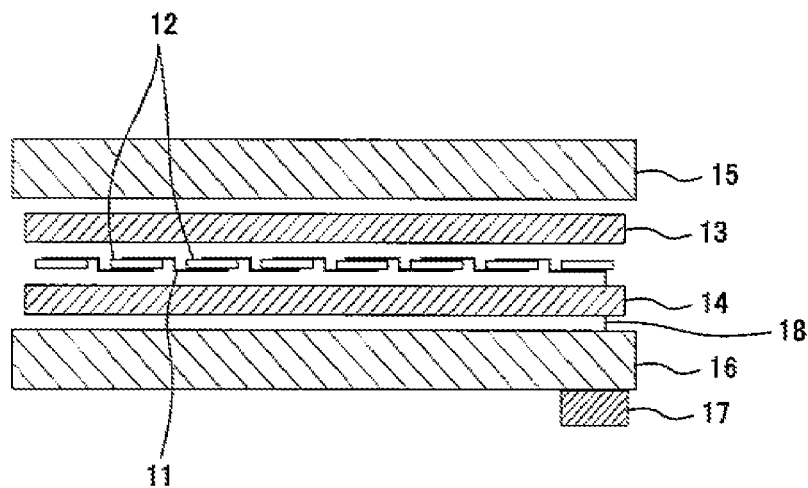
FIG. 3 is a section view showing an example of a solar cell module.
Figure 4:
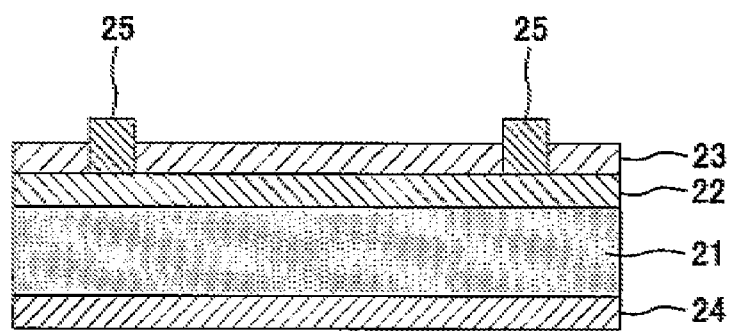
FIG. 4 is a section view showing a schematic constitution of a conventional solar cell device.

As shown in FIG. 3, the surface electrode and the back electrode of a solar cell device 12 is connected by a wiring 11. The solar cell device 12 is sandwiched between a surface filling material 13 consisting of transparent thermal plastic resin and a back filling material 14 consisting of transparent thermal plastic resin. A transparent portion 15 consisting of glass is placed on the surface filling material 1 and a back protecting material 16, in which a sheet of polyethylene terephthalate having good mechanical properties is coated with a film of polyvinyl fluoride having good weather resistance, is placed under the back filling material 14. These layered materials may be preferably heated at an appropriate vacuum furnace to remove air and integrated in one body by heating and pressing. If many solar cell device 12 are connected in series, the ends of electrodes of the first device and the last device may be preferably connected to a terminal box 17 being output taking out portion by an output taking out wiring 18. Furthermore, since the solar cell module is left in the open air for a long time, it is desirable to cover the circumference of the solar cell module with a frame material consisting of aluminum and the like.

EXAMPLES

Examples of the present invention will be described below. The present invention is not limited to the following examples and it can be appreciated by a person skilled in the art that an appropriate alteration or revision can be conducted without deviating from the extent of the present invention.

(1) Preparation of Semiconductor Wafer

N-type diffusion layer was formed on the surface of poly crystal p-type silicon board in which a thickness is 200 μm, an external shape is a square of 20 mm×20 mm, and a resistivity is 1.5 Ωcm. An antireflection layer of SiNx was formed on the n-type diffusion layer. Thus, a semiconductor wafer was prepared.

(2) Preparation of Electro-Conductive Paste a. Electro-Conductive Paste for Forming BSF Layer and Back Current Collecting Electrode Aluminum powders of 70 parts by weight with average particle diameter of about 3 μm, ethyl cellulose (organic

11 binder) of 1 parts by weight, 2,2,4-trimethyl-1, 3-pentanediol monoisobutylate (solvent) of 28 parts by weight, and $Bi_2O_3$—$B_2O_3$—ZnO containing glass frit of 1 part by weight with a softening point of about 405° C. were mixed using 3 rolls mill to obtain a paste. As a result, obtained were the electro-conductive paste for forming the BSF layer and the back current collecting electrode.

b. Electro-Conductive Paste for Forming Back Bus Bar Electrode

Silver powders of 80 Parts by weight with average particle diameter of about 1 μm, aluminum powders of 2.4 parts by weight with average particle diameter of about 3 μm, ethyl cellulose (organic binder) of 1 parts by weight, 2,2,4-trimethyl-1, 3-pentanediol monoisobutylate (solvent) of 15 parts by weight, $Bi_2O_3$—$B_2O_3$—ZnO containing glass frit of 1.5 part by weight with a softening point of about 405° C., and stearic acid of 0.1 part by weight were mixed using 3 rolls mill to obtain a paste. As a result, obtained was the electro-conductive paste for forming the back current collecting electrode.

c. Electro-Conductive Paste for Forming Surface Bus Bar Electrode and Surface Finger Electrode Examples 1 to 17

Electro-Conductive Paste Containing Bi-Containing Glass Frit

As examples 1 to 7, the alkaline earth metal soap and Te were added to electro-conductive particles (Ag powders with average particle diameter of 0.4 μm) 86 parts by weight, Bi-containing glass frit with a softening point of about 430° C. ($B_2O_3$ of 1 to 10 percent by weight, BaO of 1 to 10 percent by weight, $Bi_2O_3$ of 70 to 80 percent by weight, $Sb_2O_3$ of 1 percent by weight or less, and the others (except said matters, ZnO and CaO) of 10 percent by weight or less) of 1 parts by weight, ethyl cellulose (organic binder) of 1 parts by weight, 2,2,4-trimethyl-1,3-pentanediol monoisobutylate (solvent) of 11 parts by weight, and stearic acid (dispersing agent) of 0.5 part by weight, as shown in table 1. The matter consisting of a group of the above electro-conductive particles, Bi-containing glass frit, ethyl cellulose, 2,2,4-trimethyl-1, 3-pentanediol monoisobutylate and stearic acid is referred to as the first main paste composition hereinafter.

As examples 8 to 11, only magnesium stearate was added to the first main paste composition as shown in table 1.

As examples 12 and 13, magnesium stearate and $TeO_2$ were added to the first main paste composition as shown in table 1.

As example 14, only Te was added to the first main paste composition as shown in table 1.

As example 15, only $TeO_2$ was added to the first main paste composition as shown in table 1.

As example 16, only Se was added to the first main paste composition as shown in table 1.

As example 17, only ZnTe was added to the first main paste composition as shown in table 1.

Each composition of examples 1 to 17 was mixed using 3 rolls mill to obtain a paste. The above organic solvent was appropriately added to obtain the paste viscosity of about 300 Pa·s at a time of screen printing as described below. Thus obtained were the electro-conductive paste for forming the surface bus bar electrode and the surface finger electrode.

12

Examples 18 to 32

Electro-Conductive Paste Containing Ba-Containing Glass Frit

As examples 18 to 24, magnesium stearate and $TeO_2$ were added to electro-conductive particles (Ag powders with average particle diameter of 0.4 μm) 86 parts by weight, Ba-containing glass frit with a softening point of about 530° C. ($B_2O_3$ of 20 percent by weight or more, ZnO of 20 percent by weight or less, BaO of 40 percent by weight or more, and CaO of 10 percent by weight or more) of 1 parts by weight, ethyl cellulose (organic binder) of 1 parts by weight, 2,2,4-trimethyl-1,3-pentanediol monoisobutylate (solvent) of 11 parts by weight, and stearic acid (dispersing agent) of 0.5 part by weight, as shown in table 2. The matter consisting of a group of the above electro-conductive particles, Ba-containing glass frit, ethyl cellulose, 2,2,4-trimethyl-1,3-pentanediol monoisobutylate and stearic acid is referred to as the second main paste composition hereinafter.

As example 25 to 31, only $TeO_2$ was added to the second main paste composition as shown in table 2.

As example 32, only Te was added to the second main paste composition as shown in table 2.

Each composition of examples 18 to 32 was mixed using 3 rolls mill to obtain a paste. The above organic solvent was appropriately added to obtain the paste viscosity of about 300 Pa·s at a time of screen printing as described below. Thus obtained were the electro-conductive paste for forming the surface bus bar electrode and the surface finger electrode.

<<Contrasts 1 to 6 (Electro-Conductive Paste Containing Bi-Containing Glass Frit>>

As contrasts 1 to 5, Te of 1 percent by weight and other compounds in place of the alkaline earth metal soap were added to the first main paste composition as shown in table 3.

As contrast 6, no compound was added to the frits main paste composition as shown in table 3.

Each composition of contrast 1 to 6 was mixed using 3 rolls mill to obtain a paste. The above organic solvent was appropriately added to obtain the paste viscosity of about 300 Pa·s at a time of screen printing as described below. Thus obtained were the electro-conductive paste for forming the surface bus bar electrode and the surface finger electrode as contrasts.

<<Contrast 7 (Electro-Conductive Paste Containing Ba-Containing Glass Frit>>

As contrast 7, no compound was added to the second main paste composition as shown in table 4.

The composition of contrast 7 was mixed using 3 rolls mill to obtain a paste. The above organic solvent was appropriately added to obtain the paste viscosity of about 300 Pa·s at a time of screen printing as described below. Thus obtained were the electro-conductive paste for forming the surface bus bar electrode and the surface finger electrode as contrast.

<<References 1 to 9>>

As references 1 to 3, much magnesium stearate was added to the first main paste composition as shown in table 5. As reference 4, much tellurium was added to the first main paste composition as shown in table 5. As reference 5, much selenium was added to the first main paste composition as shown in table 5. As reference 6, much tellurium dioxide was added to the first main paste composition as shown in table 5. As reference 7, much zinc telluride was added to the first main paste composition as shown in table 5. As references 8 and 9, much tellurium dioxide was added to the second main paste composition respectively as shown in table 5. Each composition of references 1 to 9 was mixed using 3 rolls mill to obtain a paste. The above organic solvent was appropriately added to obtain the paste viscosity of about 300 Pa·s at a time of screen printing as described below. Thus obtained were the electro-conductive paste for forming the surface bus bar electrode and the surface finger electrode as references.

TABLE 1

| | additives except Te and TeO$_2$ | | parts by weight | | |
|---|---|---|---|---|---|
| | kinds | parts by weight | Te | TeO$_2$ | FF value |
| example 1 | Ca stearate | 1 | 1 | 0 | 0.665 |
| example 2 | Mg gluconate | 1 | 1 | 0 | 0.667 |
| example 3 | Sr stearate | 1 | 1 | 0 | 0.569 |
| example 4 | Mg stearate | 1 | 1 | 0 | 0.692 |
| example 5 | Mg stearate | 2 | 1 | 0 | 0.735 |
| example 6 | Mg stearate | 4 | 1 | 0 | 0.645 |
| example 7 | Mg stearate | 5 | 1 | 0 | 0.520 |
| example 8 | Mg stearate | 1 | 0 | 0 | 0.459 |
| example 9 | Mg stearate | 2 | 0 | 0 | 0.498 |
| example 10 | Mg stearate | 4 | 0 | 0 | 0.480 |
| example 11 | Mg stearate | 5 | 0 | 0 | 0.462 |
| example 12 | Mg stearate | 1 | 0 | 1 | 0.730 |
| example 13 | Mg stearate | 1 | 0 | 2 | 0.750 |
| example 14 | Mg stearate | 0 | 1 | 0 | 0.669 |
| example 15 | — | 0 | 0 | 2 | 0.708 |
| example 16 | Se | 2 | 0 | 0 | 0.642 |
| example 17 | ZnTe | 4 | 0 | 0 | 0.628 |

TABLE 2

| | additives except Te and TeO$_2$ | | parts by weight | | |
|---|---|---|---|---|---|
| | kinds | parts by weight | Te | TeO$_2$ | FF value |
| example 18 | Mg stearate | 1 | 0 | 0.1 | 0.611 |
| example 19 | Ms stearate | 1 | 0 | 0.5 | 0.759 |
| example 20 | Mg stearate | 1 | 0 | 1 | 0.768 |
| example 21 | Mg stearate | 1 | 0 | 2 | 0.771 |
| example 22 | Mg stearate | 1 | 0 | 4 | 0.780 |
| example 23 | Mg stearate | 1 | 0 | 8 | 0.690 |
| example 24 | Mg stearate | 1 | 0 | 10 | 0.611 |
| example 25 | — | 0 | 0 | 0.1 | 0.565 |
| example 26 | — | 0 | 0 | 0.5 | 0.710 |
| example 27 | — | 0 | 0 | 1 | 0.731 |
| example 28 | — | 0 | 0 | 2 | 0.751 |
| example 29 | — | 0 | 0 | 4 | 0.756 |
| example 30 | — | 0 | 0 | 8 | 0.650 |
| example 31 | — | 0 | 0 | 10 | 0.601 |
| example 32 | — | 0 | 4 | 0 | 0.755 |

TABLE 3

| | additives except Te and TeO$_2$ | | parts by weight | | |
|---|---|---|---|---|---|
| | kinds | parts by weight | Te | TeO$_2$ | FF value |
| contrast 1 | Mg oxide | 1 | 1 | 0 | 0.284 |
| contrast 2 | Ni stearate | 1 | 1 | 0 | 0.430 |
| contrast 3 | Cu stearate | 1 | 1 | 0 | 0.315 |
| contrast 4 | Sr carbonate | 1 | 1 | 0 | 0.248 |
| contrast 5 | Ca fluoride | 1 | 1 | 0 | 0.342 |
| contrast 6 | — | 0 | 0 | 0 | 0.270 |

TABLE 4

| | additives except Te and TeO$_2$ | | parts by weight | | |
|---|---|---|---|---|---|
| | kinds | parts by weight | Te | TeO$_2$ | FF value |
| contrast 7 | — | 0 | 0 | 0 | 0.282 |

TABLE 5

| | additives except Te and TeO$_2$ | | parts by weight | | |
|---|---|---|---|---|---|
| | kinds | parts by weight | Te | TeO$_2$ | FF value |
| reference 1 | Mg stearate | 8 | 1 | 0 | 0.276 |
| reference 2 | Mg stearate | 15 | 1 | 0 | 0.370 |
| reference 3 | Mg stearate | 8 | 0 | 0 | 0.270 |
| reference 4 | — | 0 | 15 | 0 | short circuit |
| reference 5 | Se | 15 | 0 | 0 | short circuit |
| reference 6 | — | 0 | 0 | 15 | short circuit |
| reference 7 | ZnTe | 15 | 0 | 0 | short circuit |
| reference 8 | — | 0 | 0 | 15 | short circuit |
| reference 9 | Mg stearate | 1 | 0 | 15 | short circuit |

(3) Printing of Electro-Conductive Paste

Almost whole surface of the back side of the semiconductor wafer prepared as described above (1) was coated with the electro-conductive paste prepared as described above (2)a by the screen printing. The electro-conductive paste prepared as described above (2)b was coated on the said electro-conductive paste by the screen printing in order to form a shape of 6a as shown in FIG. 2(b). Then, after drying at a temperature of 150° C. for five minutes, it was cooled to a room temperature by leaving it as it is.

Next, the surface side of the semiconductor wafer prepared as described above (1) was coated with the electro-conductive paste prepared as described above (2)c by the screen printing in order to form shapes of 5a and 5b as shown in FIG. 2(a). Then, after drying at a temperature of 150° C. for five minutes, it was cooled to a room temperature by leaving it as it is.

(4) Sintering

The semiconductor wafer coated with the electro-conductive paste as described above was put in a fast sintering furnace (model PV309) which has four heating zones produced by BTU company. The maximum temperature of the surface of the semiconductor wafer was measured by a temperature logger produced by Datapaq company. The said semiconductor wafer was sintered at a temperature of 800° C., which was the maximum temperature of the surface, for one minute. During this sintering process, aluminum coated on the back side of the semiconductor wafer diffuses toward the semiconductor wafer. As a result, BSF layer 4 is formed as shown in FIG. 1 and at the same time, the current collecting electrode 6b is formed as shown in FIG. 1.

(5) Evaluation of Electrical Properties

FF value of the test piece of the solar cell device produced as described above was measured as described below. As a tester, a product of trade name of KST-15Ce-1s produced by kyosin-denki corporation was used and as a solar simulator, a product of trade name of XES-502S produced by kansai-kagakukiki company was used. FF value was obtained by a curve showing a relation between voltage and current. FF values of examples, contrasts and references are shown in tables 1 to 5. A large FF value indicates a high transformation efficiency.

As clearly shown in tables 1 to 5, FF values of examples 1 to 32 of the present invention are larger than those of contrasts 1 to 7 and references 1 to 3.

By comparison between examples 1 to 7 and examples 8 to 11, FF value of the test piece containing appropriate quantity of tellurium and appropriate quantity of alkali earth metal soap is larger than that of test piece containing no tellurium and only alkali earth metal soap (magnesium stearate).

By comparison between examples 1, 2, 3 and 4, FF value of the test piece containing magnesium stearate is larger than that of test piece containing other alkali earth metal soap than magnesium stearate.

By comparison between examples 4 and 12, FF value of the test piece containing magnesium stearate and tellurium dioxide is larger than that of test piece containing magnesium stearate and tellurium.

In order to obtain an effect of controlling sintering and increase FF value, it is preferably to add magnesium stearate of 1 parts by weight to 5 parts by weight to tellurium of 1 part by weight. As shown in table 1, in order to get the maximum FF value in the range of addition of magnesium stearate of 1 parts by weight to 5 parts by weigh, it can be understood that magnesium stearate of 2 parts by weight and its approximate value (1.5 parts by weight to 2.5 parts by weight) is preferable.

By comparison between examples 12 and 20, examples 13 and 21, examples 15 and 28 respectively, FF value of the test piece containing Ba-containing glass frit tends to be larger than that of test piece containing Bi-containing glass frit.

In case of the test piece containing Ba-containing glass frit, by comparison between examples 25 to 31, FF value higher than 0.75 can be obtained by adding tellurium dioxide of 2 parts by weight to 4 parts by weight. Further, in case of the test piece containing Ba-containing glass frit, by comparison between examples 18 to 24, if both tellurium dioxide and magnesium stearate of 1 parts by weight are contained, FF value higher than 0.75 can be obtained at addition of tellurium dioxide of 0.5 parts by weight and FF value can reach the maximum by adding magnesium stearate of 1 parts by weight and tellurium dioxide of 1 parts by weight to 4 parts by weight. Further, in case of the test piece containing Ba-containing glass frit, in example 32, FF value higher than 0.75 can be obtained at addition of tellurium of 4 parts by weight and no addition of magnesium stearate.

By comparison between examples 4 to 7 and references 1 to 2, when tellurium of 1 part by weight and excessive magnesium stearate are added, an effect of controlling sintering of silver particles can be obtained but FF value is decreased due to increase of resistance.

By comparison between examples 8 to 11 and reference 3, when excessive magnesium stearate is added, an effect of controlling sintering of silver particles can be obtained but FF value is decreased due to increase of resistance.

By comparison between contrasts 1 to 5, if the electro-conductive paste contains tellurium of 1 part by weight and no organic compounds including alkali earth metal, FF value is decreased.

In references 4 to 9 in which tellurium powder, selenium powder, tellurium dioxide and zinc telluride powder are much added, the electrical conduction effect of the antireflection layer by the fire-through was very large and a short-circuit between the surface electrode and p-type silicon occurred. As a result, it was not possible to measure FF value.

The summary of evaluation on FF values of examples, contrasts and references is as follows:

(1) FF value is increased by adding appropriate quantity of magnesium stearate, a metal with a low melting point and a compound affiliated with a metal with a low melting point to the electro-conductive paste.

(2) FF value of the electro-conductive paste containing appropriate quantity of tellurium and appropriate quantity of alkali earth metal soap is larger than that of the electro-conductive paste containing no tellurium and only alkali earth metal soap. Magnesium stearate is preferable as alkali earth metal soap.

(3) When magnesium stearate and tellurium are contained in the electro-conductive paste, if magnesium stearate of 1.5 parts by weight to 2.5 part by weight is added to tellurium of 1 part by weight, it is probable that FF value of the electro-conductive paste reaches the maximum.

(4) FF value is increased if tellurium dioxide is contained in the electro-conductive paste, even though no organic compound including alkali earth metal is contained the electro-conductive paste. In this case, FF value becomes larger by using Ba-containing glass frit as glass frit.

(5) FF value of the electro-conductive paste containing magnesium stearate and tellurium dioxide is larger than that of the electro-conductive paste containing magnesium stearate and tellurium. In the case, if Ba glass frit is used as glass frit and tellurium dioxide of 1 part by weight to 4 parts by weight is added to magnesium stearate of 1 part by weight, it is probable that FF value reaches the maximum.

(6) FF value of the electro-conductive paste containing other material than organic compound including alkali earth metal is low, even though tellurium is contained.

As shown in tables 1 and 2, FF values of the test pieces of the solar cell device of examples 1 to 32 are larger than those of the test pieces of the solar cell device of contrasts 1 to 7 and references 1 to 3. Therefore, it can be understood that contact resistance of the test pieces of the solar cell device of examples 1 to 32 are smaller than those of the test pieces of the solar cell device of contrasts 1 to 7 and references 1 to 3.

INDUSTRIAL APPLICABILITY

The present invention is suitable for electro-conductive paste for forming an electrode of a solar cell device and a solar cell device.

EXPLANATION OF NUMERALS 1 silicon board
2 n-type diffusion layer
3 antireflection layer
4 BSF (back surface field) layer
5 surface electrode
5a bus bar electrode
5b finger electrode
6 back electrode
6a bus bar electrode
6b current collecting electrode
11 wiring
12 solar cell device
13 surface filling material
14 back filling material
15 transparent portion
16 back protecting material
17 terminal box
18 output taking out wiring 21 semiconductor board
22 diffusion layer
23 antireflection layer
24 back electrode
25 surface electrode

The invention claimed is:

1. An electro-conductive paste for forming an electrode of a solar cell device, consisting essentially of:
    an electro-conductive particle;
    an organic binder;
    a solvent;
    a glass frit; and
    an alkaline earth metal soap,
wherein
an average particle diameter of the electro-conductive particle is in a range of 0.1 to 15 μm, the electro-conductive particle is present in an amount of 65 to 95 percent by weight, and the alkaline earth metal soap is present in an amount of 0.1 to 5 percent by weight.

2. The electro-conductive paste for forming an electrode of a solar cell device according to claim 1, wherein the alkaline earth metal soap is calcium stearate, magnesium stearate, strontium stearate, or magnesium gluconate.

3. A solar cell device comprising:
    a diffusion layer formed on a light-absorbing side of a semiconductor board; an antireflection layer and a surface electrode formed on the diffusion layer; and
    a back electrode formed on the opposite side of the light-absorbing side of the semiconductor board,
wherein the surface electrode is formed by printing and sintering the electro-conductive paste according to claim 1 on the antireflection layer.

4. A method for producing a solar cell device comprising:
    forming a diffusion layer on a light-absorbing side of a semiconductor board;
    forming an antireflection layer on the diffusion layer;
    printing the electro-conductive paste according to claim 1 on the antireflection layer;
    forming a back electrode by printing an electro-conductive paste on the opposite side of the light-absorbing side of the semiconductor board;
    forming a surface electrode by sintering the electro-conductive paste printed on the antireflection layer to the diffusion layer; and
    forming the back electrode by sintering the electro-conductive paste on the opposite side of the light-absorbing side of the semi-conductor board.

* * * * *